United States Patent [19]

Sasaki et al.

[11] Patent Number: 4,764,796
[45] Date of Patent: Aug. 16, 1988

[54] HETEROJUNCTION FIELD EFFECT TRANSISTOR WITH TWO-DIMENSIONAL ELECTRON LAYER

[75] Inventors: Goro Sasaki; Hideki Hayashi, both of Osaka, Japan

[73] Assignee: Sumitomo Electric Industries, Ltd., Osaka, Japan

[21] Appl. No.: 939,716

[22] Filed: Dec. 9, 1986

[30] Foreign Application Priority Data

Dec. 19, 1985 [JP] Japan .................. 60-286747
Jan. 28, 1986 [JP] Japan .................. 61-17571

[51] Int. Cl.$^4$ .................. H01L 27/12; H01L 29/161; H01L 29/80
[52] U.S. Cl. .................. 357/16; 357/4; 357/22
[58] Field of Search .................. 357/16, 22 A, 22 S, 357/22 I, 22 P, 22 MD, 4, 91

[56] References Cited

U.S. PATENT DOCUMENTS 4,673,959 6/1987 Shiraki et al. .................. 357/16

FOREIGN PATENT DOCUMENTS 54-124991 9/1979 Japan .................. 357/16
58-196057 11/1983 Japan .................. 357/22 MD
59-100576 6/1984 Japan .................. 357/22 MD

OTHER PUBLICATIONS

IEEE Electron Device Letters, vol. EDL 1, No. 9, 9/80, Barnard et al. pp.174–176.
"Depletion Mode Modulation Doped $Al_{0.48}In_{0.52}As$–$Ga_{0.47}In_{0.53}As$ Heterojunction Field Effect Transistors" by Chen et al., IEEE Electron Device Letters, vol. EDL-3, No. 6, Jun. 1982, pp. 152–155.
"Rapid Thermal Annealing of Se and Be Implanted InP Using an Ultrahigh Power Argon Arc Lamp" Choudhury, et al; (Applied Physics Letter 43(4), of Aug. 15, 1983, American Institute of Physics, 1983; pp. 381–383.
"Gallium Arsenide and Related Compounds 1985", Edited by M. Fujimoto, Institute of Physics Conference Series Number 79, Adam Hilger Ltd., Bristol and Boston, Proceedings of 12th International Symposium, by K. Hirose et al., pp. 529–534.

Primary Examiner—Martin H. Edlow
Assistant Examiner—Donald J. Featherstone
Attorney, Agent, or Firm—W. G. Fasse; D. H. Kane, Jr.

[57] ABSTRACT

A field effect transistor utilizing semiconductor hetero junction having a high mutual conductance, low noise, and a reduced source resistance, has a gallium indium arsenide mixed crystal semiconductor layer (23) providing a current path, low resistance indium phosphide layers formed on or under the gallium indium arsenide mixed crystal semiconductor layer (23) by ion-implantation for achieving the reduced source resistance, a source electrode (6), a gate electrode (5) and a drain electrode (7) which are formed on the surface of an uppermost aluminum indium arsenide mixed crystal semiconductor layer (24), an ion-implanted layer located at least in a region to form the reduced source resistance between the source electrode (6) and a two-dimensional electron layer (8) within the gallium indium arsenide mixed crystal semiconductor layer (23).

12 Claims, 3 Drawing Sheets

HETEROJUNCTION FIELD EFFECT TRANSISTOR WITH TWO-DIMENSIONAL ELECTRON LAYER

FIELD OF THE INVENTION

The present invention relates to a field effect transistor with a semiconductor hetero junction, applied to a low noise amplifier circuit, a high frequency circuit, a fast logical circuit, their integrated circuits, and an integrated optics or the like.

DESCRIPTION OF THE PRIOR ART

FIG. 1 is a cross sectional view showing a structure of a conventional field effect transistor utilizing a semiconductor hetero junction, which is disclosed in, for example, an article by C. Y. Chen et all., IEEE Electron Device Letters, Vol. EDL-3, No. 6, 1982, p. 152.

In FIG. 1, a conventional field effect transistor comprises a semi-insulating indium phosphide (In P) substrate 1, an aluminum indium arsenide (Al In As) mixed crystal semiconductor layer 2 formed on the substrate 1, a gallium indium arsenide (Ga In As) mixed crystal semiconductor layer 3 formed on the mixed crystal semiconductor layer 2, an aluminum indium arsenide (Al In As) mixed crystal semiconductor layer 4 formed on the mixed crystal semiconductor layer 3, to which n-type impurities are added, a gate electrode 5 formed on the mixed crystal semiconductor layer 4, and a source electrode 6 and a drain electrode 7 provided opposed to each other on both sides of the gate electrode 5.

In the field effect transistor with such a structure, a two-dimensional electron layer 8 is formed in the Ga In As mixed crystal semicondcutor layer 3 and serves as a channel, so that a current path is formed between the source electrode 6 and the drain electrode 7.

The operation of the field effect transistor is achieved by controlling the voltage applied to the gate electrode 5 to modulate the electron density of the two-dimensional electron layer 8 immediately under the gate electrode 5 so that the drain current is modulated. In the above described structure, the Al In As mixed crystal semiconductor layer 2 is provided as a buffer layer for improving the crystal property of an epitaxially grown layer namely the Ga In As mixed crystal semiconductor layer 3 formed thereon and also for preventing e.g. a diffusion of impurities from the substrate 1.

In this structure, since electron mobility in the two-dimensional electron layer 8 within the Ga In As mixed crystal semiconductor layer 3, has a value of more than 10000 cm$^2$/V.sec at room temperature, a field effect transistor comprising a high mutual conductance, a low noise figure, and a high cut-off frequency is expected to be achieved.

However, in the field effect transistor with the above described structure, the resistance between the two-dimensional electron layer 8 under the gate electrode 5 and the source electrode 6, that is, the source resistance is not so low and hence, various problems occur in the characteristics of the transistor. For example, the non-negligible source resistance lowers the mutual conductance, the cut-off frequency, and the like. A too high source resistance also degrades the noise figure.

In order to reduce the source resistance, a method is developed in which impurities such as silicon and selenium are ion-implanted into the region between the source electrode 6 and the gate electrode 5 so that the resistance in the region between the source electrode 6 and the two-dimensional electron layer 8 is lowered. The resistance in this region is a parallel resistance formed of the Al In As mixed crystal semiconductor layers 2 and 4 and the Ga In As mixed crystal semiconductor layer 3. However, in the structure shown in FIG. 1, since the uppermost Al In As mixed crystal semiconductor layer 4 is generally very thin such as less than 1000 Å in thickness, and since electron mobility in the Al In As mixed crystal semiconductor is approximately 100 cm$^2$/V.sec which is smaller, by more than one order, than that in the Ga In As mixed crystal semiconductor, the source resistance becomes substantially equal to the resistance of the Ga In As mixed crystal semiconductor layer 3. Moreover, the mixed crystal semiconductor layer 3 is generally as thin as 1000 Å, and if impurities of more than 10$^{17}$/cm$^3$ in concentration are implanted to make the layer 3 low in resistance, the electron mobility is rapidly reduced due to electron scattering by ionized impurities. Thus, it is difficult to effectively reduce the source resistance.

FIG. 2 is a cross sectional view showing another structure of a conventional field effect transistor, which is also disclosed in an article by C. Y. Chen et al., IEEE Electron Device Letters, Vol. EDL-3, No. 6, 1982, p. 152.

The field effect transistor shown in FIG. 2 comprises a semi-insulating indium phosphide (In P) substrate 11, a gallium indium arsenide (Ga In As) mixed crystal semiconductor layer 12 formed on the substrate 11, a non-doped Al In As mixed crystal semiconductor layer 13 formed on the mixed crystal semiconductor layer 12, an aluminum indium arsenide (Al In As) mixed crystal semiconductor layer 14 doped with n-type impurities formed on the mixed crystal semiconductor layer 13, a gate electrode 5 formed on the mixed crystal semiconductor layer 14, and a source electrode 6 and a drain electrode 7 formed on the layer 14 and opposed to each other on respective sides of the gate electrode 5. In this structure, the Al In As mixed crystal semiconductor layers 13 and 14 on the Ga In As mixed crystal semiconductor layer 12 comprises a wide forbidden band gap layer 19.

In the field effect transistor shown in FIG. 2, similarly to the field effect transistor shown in FIG. 1, the two-dimensional electron layer 8 is formed along the wide forbidden band gap layer 19 in the Ga In As mixed crystal semiconductor layer 12. Electron density in the two-dimensional electron layer 8 under the gate electrode 5 is modulated by a voltage applied to the gate electrode 5 so that the drain current is modulated. As a result, the transistor operation is achieved.

In the field effect transistor shown in FIG. 2, the Ga In As mixed crystal semiconductor has a high electron mobility of more than 10000 cm$^2$/V.sec at room temperature, so that high values of approximately 440 mS/mm at room temperature and approximately 700 mS/mm at 77° K. have been obtained in the device having a gate length of 1 μm as mutual conductance indicative of the performance of the device, please refer to Proceedings of 12th International Symposium on Gallium Arsenide and Related Compounds, by K. Hirose et al., entitled "700 ms/mm 2 DEGFETs fabricated from high mobility MBE-grown n-Al In As/Ga In As hetero structures", pp. 529–534.

However, in the field effect transistor with this structure, the source resistance can not be neglected, so that transistor characteristics such as the mutual conductance and the noise figure are limited by the source resistance. In order to reduce the source resistance, it would be considered that n-type impurities are ion-implanted at least into a region to form a source resistance as described above and then, flash annealing or the like is performed to activate the implanted n-type impurities, so that the region to form a source resistance is made to have a low resistance.

However, in this case as well, similarly to the explanation concerning the field effect transistor shown in FIG. 1, the following has been found from an experiment that the present inventors have performed. More specifically, in the field effect transistor having a wide forbidden band gap layer comprising only an Al In As mixed crystal semiconductor layer, the rate of activated n-type impurities ion-implanted into the Al In As semiconductor layer is low, and the electron mobility in the Al In As mixed crystal semiconductor layer is also low namely less than 300 $cm^2/V.sec$, so that it is difficult to reduce sufficiently the resistivity of the ion-implanted Al In As mixed crystal semiconductor layer. As a result, even if the ion-implantation technique is employed in the field effect transistor with a conventional structure, the source resistance can not be sufficiently reduced, so that it is difficult to improve the transistor characteristics.

As described above, in the structure of the conventional field effect transistor, there were disadvantages that the source resistance can not be sufficiently reduced and the characteristics of the conventional field effect transistor such as the mutual conductance, the cut-off frequency, the noise figure and the like can not be sufficiently improved.

SUMMARY OF THE INVENTION

It is an object of the present to remove the disadvantages of the conventional field effect transistor and to provide a field effect transistor having a sufficiently low source resistance and excellent operating characteristics as a field effect transistor.

The field effect transistor according to the present invention is adapted such that in order to reduce the source resistance, an In P semiconductor layer is provided between a Ga In As mixed crystal semiconductor layer in which a two-dimensional electron layer is formed, and an overlying Al In As mixed crystal semiconductor layer, or between a Ga In As mixed crystal semiconductor layer and a semi-insulating substrate, and n-type impurities are ion-implanted into at least the region to form a source resistance.

If the In P semiconductor layer is formed under the overlying Ga In As mixed crystal semiconductor layer, ion-implantation is performed to the depth reaching at least the In P layer.

If the In P semiconductor layer is formed on the underlying Ga In As mixed crystal layer, ion-implantation is performed to the depth reaching the interior of the Ga In As mixed crystal semiconductor layer.

In accordance with the above described structure, the rate of activation of implanted ion in the In P semiconductor layer is very high and, therefore, electron mobility of the ion-implanted In P semiconductor is higher, by more than one order, than that of the Al In As mixed crystal semiconductor. Thus, when a lower resistance of the In P semiconductor layer is provided in parallel with the resistance of the Ga In As mixed crystal semiconductor layer, the source resistance can be effectively reduced, and further a gate electrode is formed on the Al In As mixed crystal semiconductor layer, so that a Schottky junction at the gate electrode can be easily formed.

These objects and other objects, features, aspects and advantages of the present invention will become more apparent from the following detailed description of the present invention when taken in conjunction with the accompanying drawings.

DETAILED DESCRIPTION OF THE PREFERRED EMBODIMENTS AND OF THE BEST MODE OF THE INVENTION

Prior to the specific embodiment, an experimental fact for supporting the present invention is described.

According to a report of the result of an experiment in which n-type impurities are implanted into an In P semiconductor and annealing is performed, refer to Applied Physics Letters, Vol. 43, No. 15, 1983, p. 381, a rate of activation of implanted ions of more than 60% and an electron mobility of more than 2000 $cm^2/V.sec$ are obtained in an ion-implanted layer in an In P semiconductor. Therefore, if n-type impurities of $10^{14}/cm^2$ are implanted, the sheet resistance of the ion-implanted layer can be less than 50 $\Omega/\square$ in the In P semiconductor.

On the other hand, according to an experiment made by the present inventors, if n-type impurities of $10^{14}/cm^2$ were ion-implanted into an Al In As mixed crystal semiconductor, the sheet resistance became approximately 1 $k\Omega/\square$. This is because both electron mobility and the rate of activation of implanted ions in the In P semiconductor are larger than those of an Al In As mixed crystal semiconductor.

From the foregoing, when the Al In As mixed crystal semiconductor layer is replaced in a region for forming a source resistance by the In P mixed crystal having an ion-implanted region, the source resistance can be effectively reduced.

Specific embodiments of the present invention are described in detail hereinafter.

Figure 1:
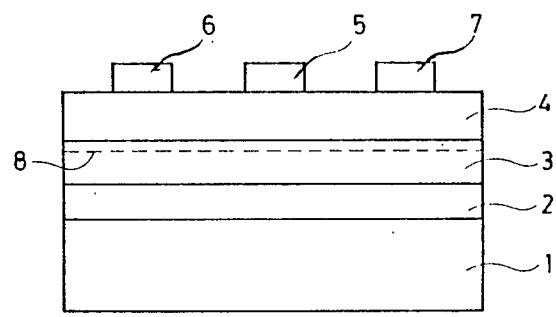
FIG. 1 is a cross sectional view showing a structure of a conventional field effect transistor.
Figure 2:
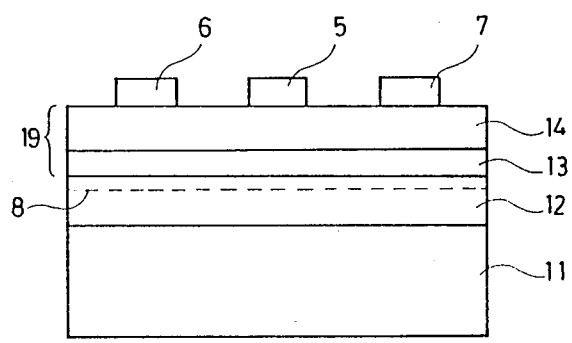
FIG. 2 is a cross sectional view showing another structure of a conventional field effect transistor.
Figure 3:
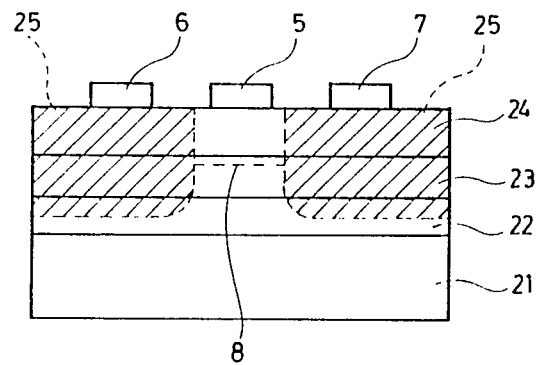
FIG. 3 is a cross sectional view showing a structure of a field effect transistor according to an embodiment of the present invention.

Referring now to FIG. 3, a manufacturing process and structure of a field effect transistor according to an embodiment of the present invention are described.

An In P layer 22, a Ga In As mixed crystal semiconductor layer 23, and an Al In As mixed crystal semiconductor layer 24 are formed, in this order, on an IN P semi-insulating substrate 21 by using a gas source molecular beam epitaxial growth or by using a metal organic chemical vapor deposition (MOCVD). It is desirable that the In P layer 22 is an n-type doped with impurities of less than $10^{15}/cm^3$ or a p-type doped with impurities of less than $10^{16} cm^3$ in concentration. Preferably, the layer 22 has a thickness of, for example, approximately 1 μm. If ion-implantation is performed into the In P layer 22, the electron mobility is 2000 $cm^2$/V.sec, which is larger, by one order than that of the Al In As mixed crystal semiconductor. Therefore, even though the thickness In P layer is more than 1 μm, there occurs no problem in the functional characteristics of the device.

The Ga In As mixed crystal semiconductor layer 23 is made to be of an n-type or a p-type having an impurity concentration of less than $10^{16}/cm^3$ and the thickness thereof is made to be approximately 0.1 μm. In determining an impurity concentration and a thickness of these layers, it is important that the In P semiconductor layer 22 is in a depletion state when the transistor operates. The Al In As mixed crystal semiconductor layer 24 is made to be of an n-type having an impurity concentration of approximately $10^{18}/cm^3$ and the thickness thereof is, for example, 400 Å. After forming these epitaxial layers, n-type impurities such as silicon, having, for example, a dose of more than $10^{14}/cm^2$ at an acceleration voltage of more than 100 KeV are implanted by ion implantation, whereby an ion-implanted layer reaching the In P semiconductor layer 22 is formed. Thereafter, annealing is performed, for example, for approximately ten seconds at 800° C., so that a low resistive region 25 is formed. The ion-implanted region is not formed in the portion underlying the region to form the gate electrode. This is achieved by, for example, forming a dummy gate on the region to form the gate electrode and performing ion-implantation utilizing the dummy gate as a mask.

An ohmic electrode of gold-germanium alloy and the like is formed at a predetermined region on the surface of the Al In As mixed crystal semiconductor layer 24 by using evaporation and is alloyed with the mixed crystal semiconductor layer 24, so that a source electrode 6 and a drain electrode 7 are formed.

Finally, a gate electrode 5 comprising platinum, gold, aluminum or the like is formed by using evaporation on the region of Al In As mixed crystal semiconductor layer 24 in which the lower resistive layer 25 is not formed. Thus, the field effect transistor is completed.

In the field effect transistor shown in FIG. 3 as described above, since lower resistance of a conductive layer comprising the In P semiconductor layer 22 is provided in parallel with the resistance of the Ga In As mixed crystal semiconductor layer 23, the resistance between the source electrode 6 and a two-dimensional electron layer 8 under the gate electrode 5, that is, the source resistance, is effectively reduced.

In the above described embodiment, since impurity ions are implanted at a high acceleration voltage, impurities can be distributed mainly within the In P layer 22, and the source resistance can be reduced while maintaining a low impurity concentration in the neighborhood of the gate electrode 5. It is important to maintain a low impurity concentration in the neighborhood of the gate electrode 5 to raise the breakdown voltage of the gate in the transistor. Thus, transistor characteristics can be improved without decreasing the breakdown voltage of the gate in the manner described above with regard to the embodiment of FIG. 3.

Figure 4:
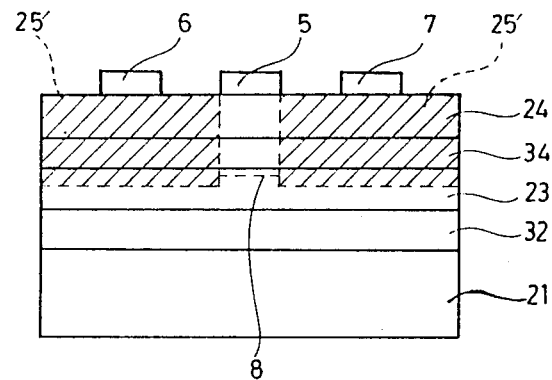
FIG. 4 is a cross sectional view showing a structure of a field effect transistor comprising a wide forbidden band gap layer including two layer members, according to another embodiment of the present invention.

Referring to FIG. 4, a manufacturing process and a structure of the field effect transistor comprising a wide forbidden band gap layer, according to another embodiment of the present invention are described.

An Al In As mixed crystal semiconductor layer 32 serving as a buffer layer is formed on the In P semi-insulating substrate 21 by using a metal organic chemical vapor deposition (MOCVD) or by using a gas source molecular beam epitaxial growth and then, the Ga In As mixed crystal semiconductor layer 23, an In P layer 34, and the Al In As mixed crystal semiconductor layer 24 are formed by using the same process. The In P layer 34 and the Al In As mixed crystal semiconductor layer 24 form a wide forbidden band gap layer 39. When ion-implantation is performed into the In P semiconductor, the rate of activation of implanted ions is high and the sheet resistance thereof can be made smaller, by more than one order, than that of the Al In As mixed semiconductor. Hence, the In P semiconductor layer can be used as a wide forbidden band gap layer. However, if the wide forbidden band gap layer which effectively reduces the source resistance comprises only the In P semiconductor layer, various problems as described below occur. More specifically, in the field effect transistor with such a structure as shown, the gate electrode 5 must form a Schottky junction with a wide forbidden band gap layer 39. However, it is generally difficult to form a Schottky junction with the In P semiconductor. The Al In As mixed crystal semiconductor layer 24 with which a Schottky junction can be easily formed is provided on the surface of the In P layer 34 to make the wide forbidden band gap layer 39 a multilayer structure, so that an effective reduction of the source resistance and excellent gate characteristics through the formation of a stable Schottky junction are achieved.

The Al In As mixed crystal semiconductor layer 32 serving as a buffer layer is provided for improving the crystal property of the epitaxial growth layer formed thereon and for preventing, for example, the diffusion of impurities from the semi-insulating substrate 21. However, the Al In As mixed crystal semiconductor layer 32 may not be provided, where the characteristics or the like required for a transistor prevent the use of the layer 32.

The thickness of each layer 32, 23, 34, 24 differs depending on the design value of the threshold voltage of a transistor or the like. Typically, the Al In As mixed crystal semiconductor layer 32 serving as a buffer layer, is approximately 0.5 μm thick, the Ga In As mixed crystal semiconductor layer 23 is approximately 20 nm to 200 nm thick, the In P layer 34 is approximately 10 nm to 30 nm thick, and the Al In As mixed crystal semiconductor layer 24 is approximately 10 nm in thickness. The amount of impurities added to each layer before formation of a low resistive layer also differs depending on the design value of the threshold voltage or the like. Typically, if major concern resides in uniformity and reproducability of the threshold voltage, impurities are not added to all layers. However, where the major interest is in the capacity of supplying a large current, n-type impurities of approximately $2 \times 10^{18}/cm^3$ are added to the In P layer 34. In the latter case, the region in the range of approximately 10 nm from the surface on the side of the Ga In As mixed crystal semiconductor layer 23 in the In P layer 34 may be a non-doped region for preventing the hetero junction interface from being damaged e.g. by deterioration.

After performing the epitaxial growth in each layer as described above, n-type impurities such as silicon and selenium are ion-implanted into the region except for the region to form the gate electrode under the condition of an acceleration voltage of more than 100 KeV and a dose of more than $10^{14}/cm^2$. For example, annealing is performed at 800° C. for ten seconds, so that a low resistive region 25' comprising an ion-implanted layer reaching the interior of the Ga In As mixed crystal semiconductor layer 23 is formed.

Ohmic electrodes of gold, germanium or the like are formed in a predetermined region on the surface of the Al In As mixed crystal semiconductor layer 24. Then, these ohmic electrodes are alloyed with the underlying mixed crystal semiconductor layer 24 whereby the source electrode 6 and the drain electrode 7 are formed.

Furthermore, the gate electrode 5 made of aluminum, platinum, tungsten, silicide or the like is formed on the surface of the region in which the low resistive region 25' between the source electrode 6 and the drain electrode 7 is located. The gate electrode 5 can be made by evaporation or the like, whereby the field effect transistor is completed.

It is desirable that the low resistive region 25' obtained by ion-implantation of n-type impurities does not overlap with the gate electrode 5 for the purpose of reducing any parasitic capacitance and for improving the reverse direction breakdown voltage.

Figure 5:
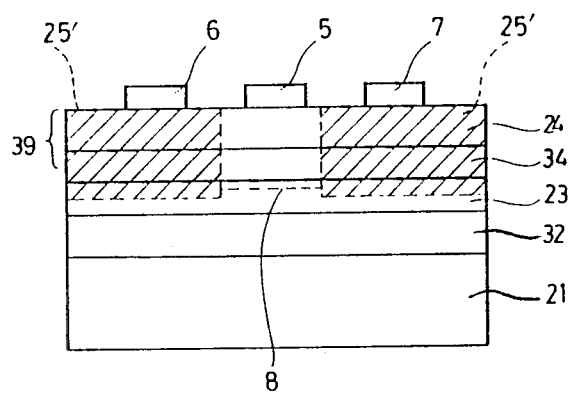
FIG. 5 is a cross sectional view showing a variation of an improvement of the field effect transistor shown in FIG. 4.

In the field effect transistor shown in FIG. 5, the low resistive region 25' obtained by ion-implantation of n-type impurities does not overlap with the gate electrode 5. If the accuracy of mask alignment of the photolithography technique in the transistor manufacturing process is satisfactory, the overlapping region can be surely removed without any difficulty. However, if the accuracy of mask alignment of the photolithography technique is not satisfactory and reproducability of transistor characteristics is not sufficient, it becomes necessary to use the self-alignment technique utilizing a refractory gate or a dummy gate. More specifically, a refractory gate or a dummy gate each having a size slightly larger than that of the gate electrode 5, is formed in the region for the gate electrode 5, and ion-implantation is performed utilizing the dummy gate as a mask in a self-alignment manner, so that the overlap of the gate electrode 5 with the low resistive region 25' can be surely removed.

However, regardless whether the self-alignment technique is used or not, the field effect transistor with a structure shown in FIGS. 4 and 5 can effectively reduce the source resistance, so that a field effect transistor having a high mutual conductance and a low noise can be obtained.

Figure 6:
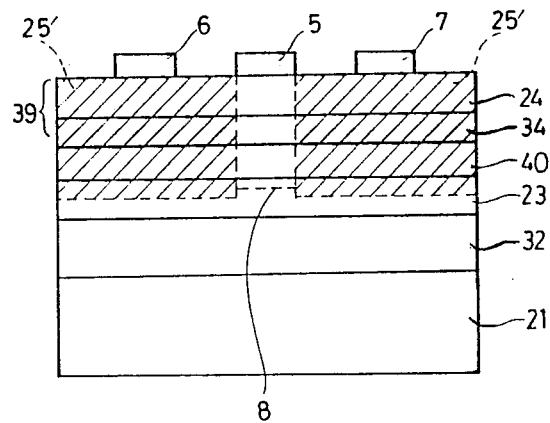
FIG. 6 is a cross sectional view showing a structure of a field effect transistor comprising a wide forbidden band gap layer including two layer members, of still another embodiment according to the present invention.

FIG. 6 is a cross sectional view showing a structure according to another embodiment of the present invention. In addition to the structure of the field effect transistor shown in FIG. 4, the field effect transistor shown in FIG. 6 comprises an Al In As mixed crystal semiconductor layer 40 provided between the Ga In As mixed crystal semiconductor layer 23 and the In P semiconductor layer 34 in order to enhance the quantam mechanical enclosing effect of two-dimensional electron forming a channel. It is desirable that the Al In As mixed crystal semiconductor layer 40 has a thickness in the range of 50–100 Å and that it includes non-doped impurities.

Since electron affinity in the Al In As mixed crystal semiconductor layer 40 is smaller than that in the In P semiconductor layer 34, a high energy barrier against two-dimensional electron is formed in the Ga In As mixed crystal semiconductor layer 23. As a result, the quantum mechanical enclosing effect for two-dimensional electron in the Ga In As mixed crystal semiconductor layer 23 is enhanced so that excellent transistor characteristics can be obtained even if a high gate voltage is applied.

As described in the foregoing, according to the present invention, in the field effect transistor using a semiconductor hetero junction, a low resistance In P mixed crystal layer is provided in a region for forming a source resistance by ion-implantation of impurities, and a low resistive region is formed at least in the region where a source resistance is formed by ion implantation, so that the source resistance can be effectively reduced and a field effect transistor having a high mutual conductance and a low noise figure can be obtained. As a result, a large contribution is made to the application field such as a low noise amplifier circuit, a fast logical circuit, integrated circuits thereof, or in integrated optical devices.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A field effect transistor utilizing semiconductor hetero junction, comprising a semi-insulating substrate (21); an indium phosphide In P layer (22) disposed on said semi-insulating substrate (21); an gallium indium arsenide Ga In As mixed crystal semiconductor layer (23) formed on said indium phosphide In P layer (22), said mixed crystal semiconductor layer (23) having a current path formed therein; a single outer layer (24) formed on and contacting said Ga In As mixed crystal semiconductor layer (23), said single outer layer including at least an aluminum indium arsenide Al In As mixed crystal semiconductor layer (24); said indium phosphide In P layer (22) being disposed between said Ga In As mixed crystal semiconductor layer (23) and said semi-insulating substrate (21); a gate electrode (5) formed in a predetermined region on the outer surface of said single outer layer (24) of said Al In As mixed crystal semiconductor, a source electrode (6) and a drain electrode (7) provided opposed to each other on respective sides of said gate electrode (5), and an ion-implanted layer (25) formed by implanting impurity ions at least into a region between said gate electrode (5) and said source electrode (6) and between said gate electrode (5) and said drain electrode (7), said ion-implanted layer being formed to a depth reaching at least said In P layer (22) for reducing the source resistance of said field effect transistor.

2. The field effect transistor of claim 1, wherein said In P layer (22) is approximately 1 μm in thickness.

3. The field effect transistor of claim 1, wherein said In P layer (22) is formed as an n-type layer having doped impurities of less than $10^{15}/cm^3$ in concentration.

4. The field effect transistor of claim 1, wherein said In P layer (22) is formed as a p-type layer having doped impurities of about $10^{16}/cm^3$ in concentration.

5. The field effect transistor of claim 1, wherein said Al In As mixed crystal semiconductor layer (24) is formed as an n-type layer having doped impurities of the order of $10^{18}/cm^3$ in concentration.

6. The field effect transistor of claim 1, wherein said ion-implanted layer (25) is an n-type layer in which n-type impurities are implanted under the condition of an acceleration voltage of 100 keV and a dose of more than $10^{14}/cm^2$.

7. A field effect transistor utilizing semiconductor hetero junction, comprising a first layer forming a semi-insulating substrate (21); a second layer (32) of aluminum indium arsenide Al In As formed as a mixed crystal semiconductor on said substrate (21); a third layer (23) of gallium indium arsenide Ga In As formed as a mixed crystal semiconductor layer on said second layer, said third layer having a current path formed therein; a fourth layer (40) of aluminum indium arsenide Al In As formed as a mixed crystal semiconductor on said third layer (23); a fifth layer (34) of indium phosphide In P formed on said fourth layer (40) for reducing the source resistance of said field effect transistor; a sixth layer (24) of aluminum indium arsenide Al In As formed as a mixed crystal semiconductor on said fifth layer (34) of indium phosphide In P; a gate electrode (5) formed in a predetermined region on the surface of said sixth layer (24) of Al In As mixed crystal semiconductor; a source electrode (6) and a drain electrode (7) provided opposed to each other on respective sides of said gate electrode (5); and ion-implanted layer means (25') formed by implanting impurity ions at least into a region between said gate electrode (5) and said source electrode (6) and between said gate electrode (5) and said drain electrode (7).

8. The field effect transistor of claim 7, wherein said ion-implanted layer (25') is formed to a depth reaching into said third layer (23) formed as a Ga In As mixed crystal semiconductor layer.

9. The field effect transistor of claim 7, wherein at least said third layer (23) formed as a Ga In As mixed crystal semiconductor layer, said fifth layer (34) formed as an In P layer, and said sixth layer (24) formed as an Al In As mixed crystal semiconductor layer do not include any doped impurities.

10. The field effect transistor of claim 7, wherein said fifth layer (34) formed as an In P layer (34) is formed under the condition that n-type impurities are doped into said fifth layer (34) in a concentration in the order of $10^{18}/cm^3$.

11. The field effect transistor of claim 10, wherein said fifth In P layer (34) includes a non-doped region in a range of approximately 10 nm from a surface contacting said third Ga In As mixed crystal semiconductor layer (23).

12. The field effect transistor of claim 8, wherein said ion-implanted layer means (25') is a n-type layer in which n-type impurity ions are implanted under the condition of an acceleration voltage of more than 100 KeV and a dose of more than $10^{14}/cm^2$.

* * * * *